United States Patent
Corea et al.

(10) Patent No.: US 12,371,779 B2
(45) Date of Patent: Jul. 29, 2025

(54) REACTION CHAMBER COMPRISING A ROTATING ELEMENT FOR THE DEPOSITION OF A SEMICONDUCTOR MATERIAL

(71) Applicants: LPE S.P.A., Baranzate (IT); DENSO CORPORATION, Aichi-Pref (JP)

(72) Inventors: Francesco Corea, Baranzate (IT); Danilo Crippa, Baranzate (IT); Maurilio Meschia, Baranzate (IT); Yuichiro Tokuda, Aichi-Pref (JP)

(73) Assignees: LPE S.P.A., Baranzate (IT); DENSO CORPORATION, Aichi-Pref (JP)

( * ) Notice: Subject to any disclaimer, the term of this patent is extended or adjusted under 35 U.S.C. 154(b) by 878 days.

(21) Appl. No.: 17/420,557

(22) PCT Filed: Jan. 7, 2020

(86) PCT No.: PCT/IB2020/050090
§ 371 (c)(1),
(2) Date: Jul. 2, 2021

(87) PCT Pub. No.: WO2020/144577
PCT Pub. Date: Jul. 16, 2020

(65) Prior Publication Data
US 2021/0388492 A1    Dec. 16, 2021

(30) Foreign Application Priority Data
Jan. 9, 2019    (IT) .................. 102019000000223

(51) Int. Cl.
*C23C 16/44*    (2006.01)
*C30B 23/06*    (2006.01)
*C30B 25/10*    (2006.01)

(52) U.S. Cl.
CPC .......... *C23C 16/4401* (2013.01); *C30B 23/06* (2013.01); *C30B 25/10* (2013.01)

(58) Field of Classification Search
CPC .......... C30B 23/00; C30B 23/06; C30B 25/08; C30B 25/10
See application file for complete search history.

(56) References Cited

U.S. PATENT DOCUMENTS 4,926,793 A * 5/1990 Arima ............... C23C 16/45508
                                                          118/728
9,441,311 B2    9/2016 Hashimoto et al.
(Continued)

FOREIGN PATENT DOCUMENTS

EP    1471168 A1    10/2004
EP    1900856 A2    3/2008
(Continued)

*Primary Examiner* — Aiden Lee
(74) *Attorney, Agent, or Firm* — Dickinson Wright PLLC; Andrew D. Dorisio

(57) ABSTRACT

The reaction chamber (100) is designed for a reactor (100) for deposition of layers of semiconductor material on substrates; it comprises a tube (110) and an injector (20) and a holder (30); the tube (110) is made of quartz and has a cylindrical or prismatic shape and surrounds a reaction and deposition zone; the injector (20) is arranged to inject precursor gases into the reaction and deposition zone; the holder (30) is arranged to support a substrate in the reaction and deposition zone during deposition processes; graphite susceptor elements (10, 40, 50) are located inside the tube (110) for heating the reaction and deposition zone and components inside the reaction and deposition zone; an inductor system (60, 70) is located outside the tube (110) for providing energy to the susceptor elements (10, 40, 50) by electromagnetic induction; a rotating element (80) in the form of a cylindrical or prismatic tube is located inside the reaction and deposition zone and surrounds the injector (20).

13 Claims, 4 Drawing Sheets

(56) References Cited

U.S. PATENT DOCUMENTS

Figure 1:
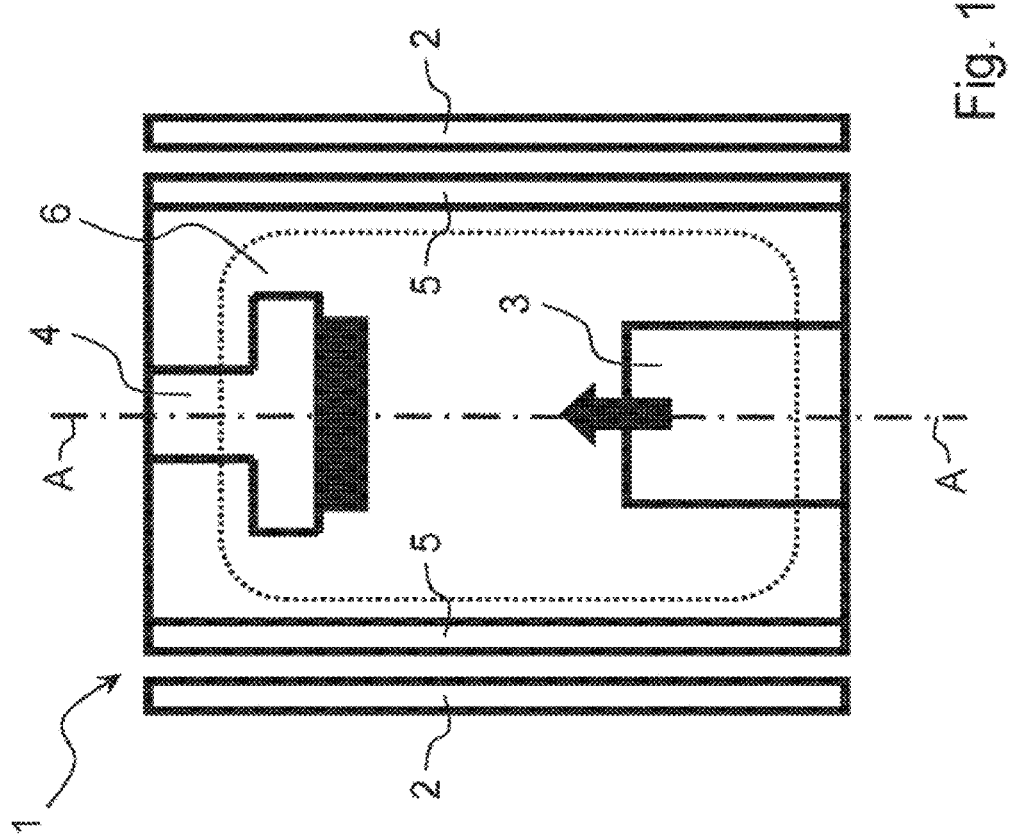

| | | | | |
|---|---|---|---|---|
| 2008/0053371 | A1* | 3/2008 | Nagakubo | C30B 25/14 |
| | | | | 117/200 |
| 2008/0257262 | A1* | 10/2008 | Kong | C30B 25/12 |
| | | | | 118/725 |
| 2016/0002820 | A1* | 1/2016 | Hori | C30B 23/00 |
| | | | | 432/265 |

FOREIGN PATENT DOCUMENTS

| | | |
|---|---|---|
| JP | 5930799 A | 2/1984 |
| JP | H03237732 A | 10/1991 |
| JP | H06267871 A | 9/1994 |
| JP | H07277871 A | 10/1995 |
| JP | 2010280527 A | 12/2010 |
| JP | 2013043805 A | 3/2013 |
| JP | 20141108 | 1/2014 |
| JP | 2014055077 A | 3/2014 |
| WO | WO8904055 A1 | 5/1989 |
| WO | 2004111316 A1 | 12/2004 |
| WO | 2006125777 A1 | 11/2006 |

\* cited by examiner

REACTION CHAMBER COMPRISING A ROTATING ELEMENT FOR THE DEPOSITION OF A SEMICONDUCTOR MATERIAL

FIELD OF THE INVENTION

The present invention relates to a reaction chamber with rotating element and a reactor for deposition of semiconductor material.

STATE OF THE ART

As is known, the reaction chambers of the reactors for deposition of layers of semiconductor material on substrates, sometimes called "seeds", are equipped with a reaction and deposition zone. In particular, (see for example FIG. 1—similar to FIG. 2 and FIG. 3 of WO2004111316A1 and to FIG. 1 of JP2010280527A) the chamber often (1 in FIG. 1) comprises a tube (2 in FIG. 1), an injector (3 in FIG. 1) and a support (4 in FIG. 1); the tube surrounds a reaction and deposition zone (in FIG. 1; this zone can be considered as the volume associated with the reference 6 or with the entire volume inside the tubular element 5), the injector is arranged to inject precursor gases into the reaction and deposition zone, and the holder is arranged to support a substrate in the reaction and deposition zone during deposition processes.

It is also known that during deposition processes, material can be deposited not only on the substrates, but also elsewhere, in particular on the external surface of the injector (see for example the injector of WO2006125777A1 and JP2010280527A).

To overcome this problem, it is possible to try and design the chamber in such a way as to limit spurious depositions on the external surface of the injector during deposition processes.

However, it is not impossible to completely avoid such spurious depositions; this is particularly true for certain types of reactors.

The Applicant has focused in particular on this problem in the reactors for deposition of layers, for example of silicon carbide on substrates at very high temperature (typically, higher than 2000° C., and which can reach up to 3000° C.), more particularly for the "bulk" growth of "ingots/crystals" of silicon carbide on "seeds" of silicon carbide.

In fact, in such reactors, the injector is often located in whole or in large part within the reaction and deposition zone (see, for example, FIG. 1) and therefore the problem of spurious depositions on the external surface of the injector is relevant.

SUMMARY

The general object of the present invention is to provide a reaction chamber which avoids or at least reduces the drawbacks associated with spurious depositions on the external surface of the injector. A first possible drawback is linked to the fact that spurious deposits tend to create particles, for example because they poorly adhere to the surfaces on which they are present. A second possible drawback is linked to the fact that spurious deposits are an (indirect) source of variation in the composition of the material deposited on the substrates; we recall here for example the "autodoping" phenomenon. A third possible drawback is linked to possible mechanical effects due to spurious deposits: difficulty in dismantling the reactor, interferences with moving parts of the reactor.

This general object is reached thanks to what is expressed in the appended claims that form an integral part of the present description.

The idea behind the present invention is to use a body which moves suitably within the reaction and deposition zone and which limits spurious deposits. In particular, these spurious deposits are removed from the body as soon as they tend to exceed a predetermined thickness and/or to leave a predetermined space. This idea is applicable not only to the reactor injector.

LIST OF FIGURES

Figure 2:
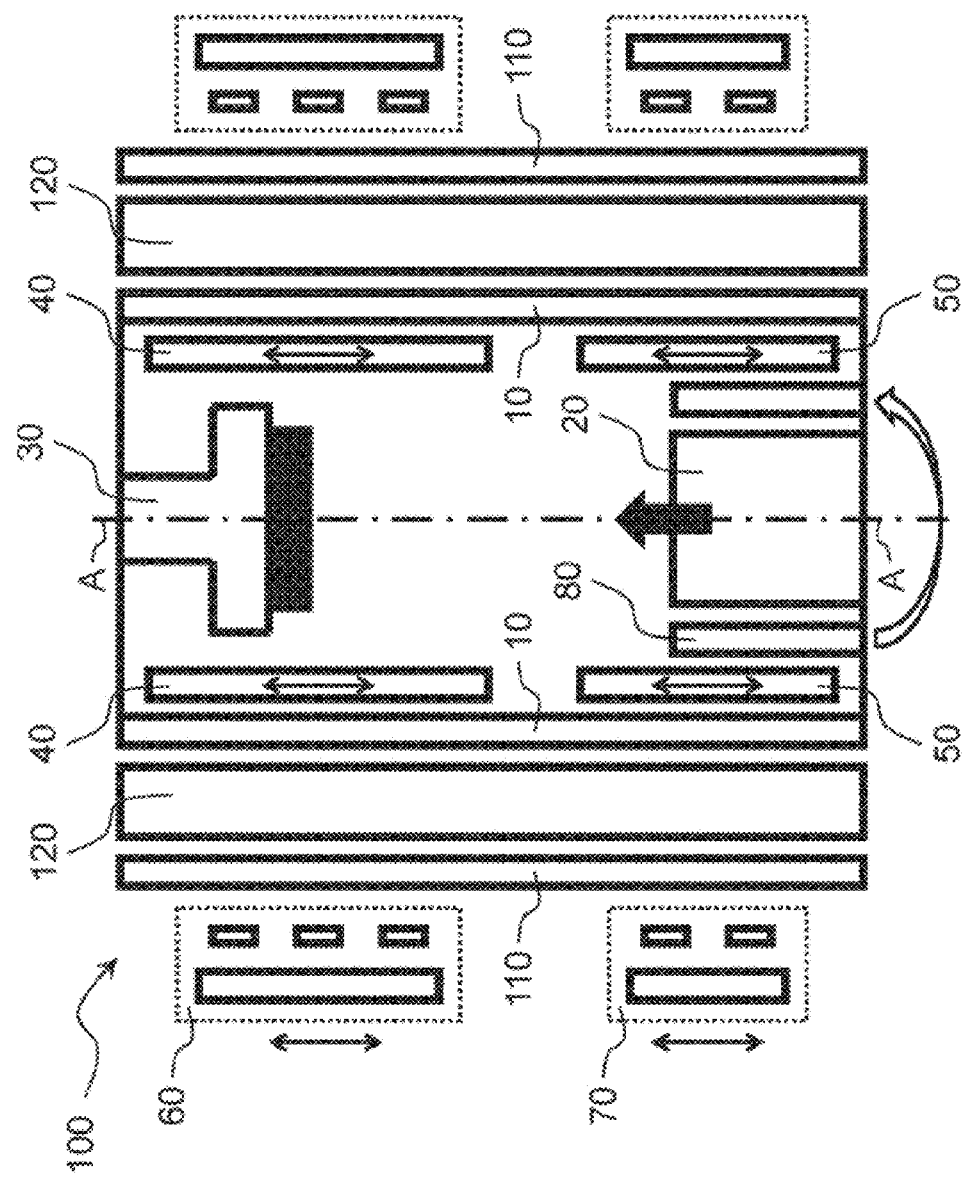
Figure 3:
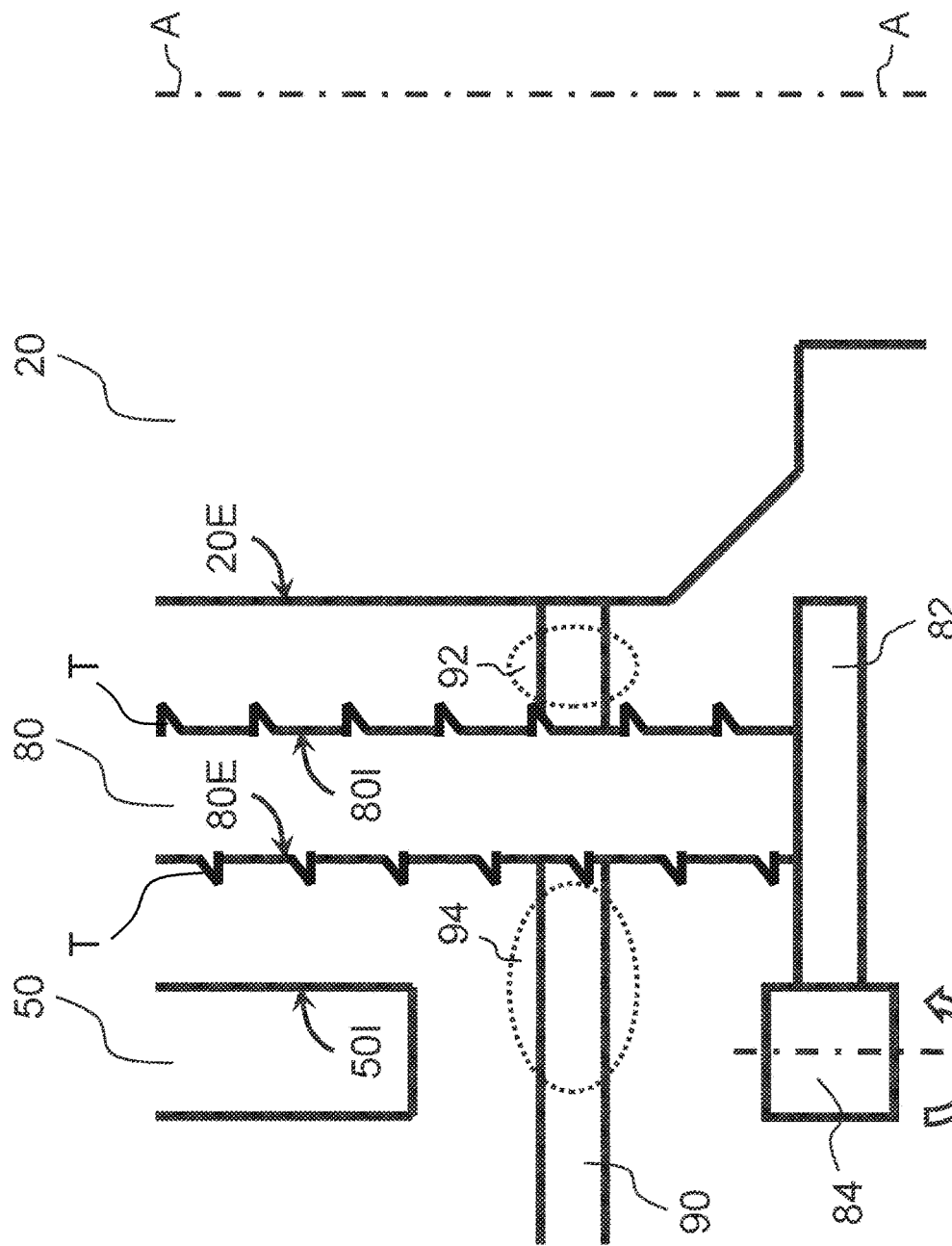

The present invention shall become more readily apparent from the detailed description that follows to be considered together with the accompanying drawings in which:

FIG. 1 shows, very schematically, in side section, a reaction chamber of a reactor for deposition of silicon carbide at a very high temperature according to the prior art, FIG. 2 shows, schematically, in side section, an example of a reaction chamber of a reactor for deposition of silicon carbide at a very high temperature according to the present invention, and FIG. 3 shows a (partial) detail of the chamber of FIG. 2.

Figure 4:
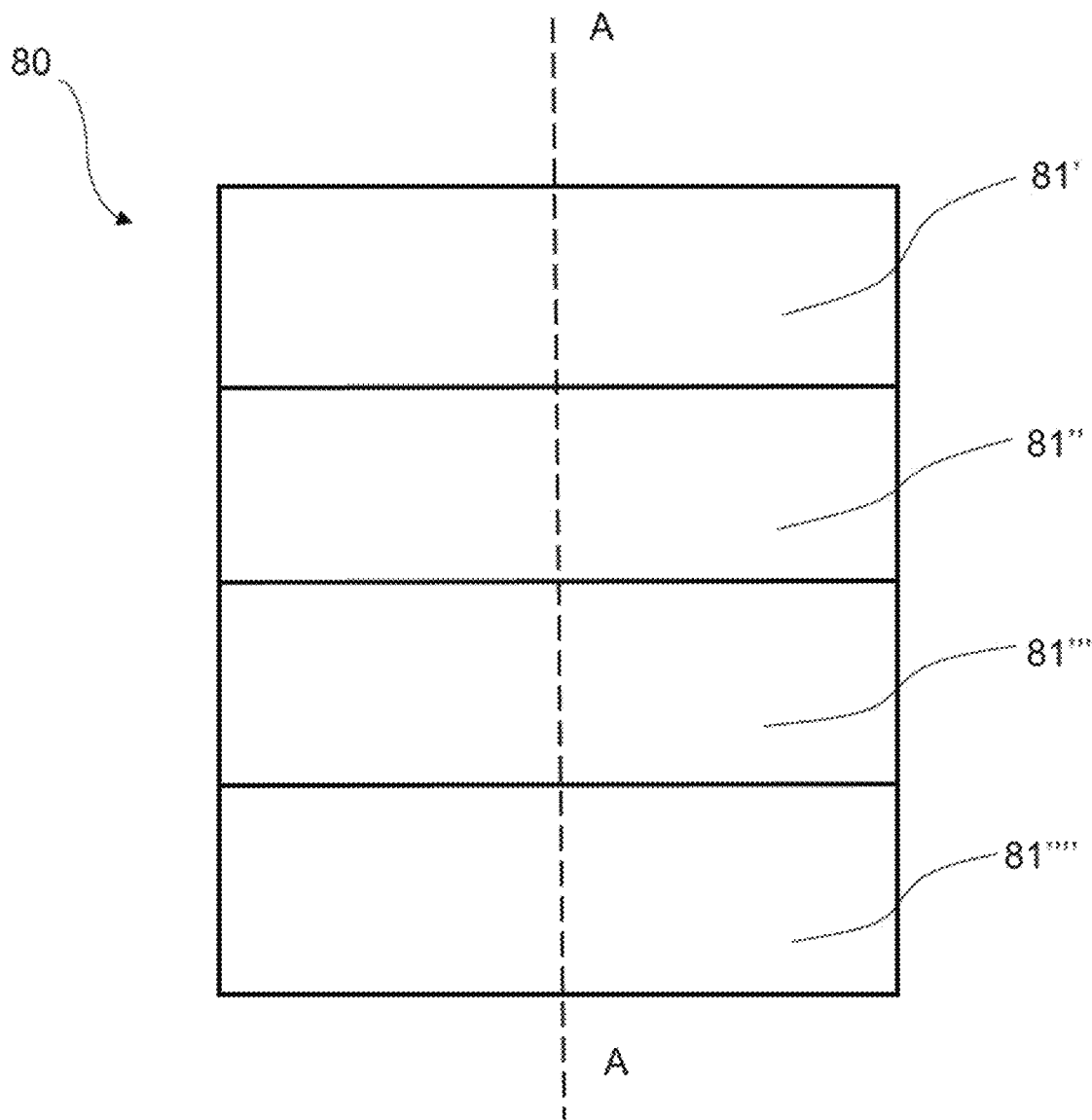

FIG. 4 shows a side elevational view of one embodiment of a rotating element of the chamber of FIG. 2.

As can be easily understood, there are various ways of practically implementing the present invention which is defined in its main advantageous aspects in the appended claims and is not limited either to the following detailed description or to the appended claims.

DETAILED DESCRIPTION

In the reaction chamber 1 of a reactor for deposition of layers of semiconductor material on substrates of FIG. 1, there is an injector 3 represented, for simplicity's sake, as if it were of perfectly cylindrical shape. To understand the solution of FIG. 2 (based on a cylindrical or rotating prismatic tube), the side surface of this cylinder should be mainly taken into consideration, in fact spurious deposition occurs in particular on this external surface.

In FIG. 2, the injector is associated with the reference 20 and is analogous to the injector 3 of FIG. 1.

In the chamber of FIG. 1, the material continues to slowly deposit on the injector 3 during the deposition processes.

In the chamber of FIG. 2, thanks to a mobile element 80 (having a cylindrical or prismatic surface close, for example at a distance of 2-3 mm, to the cylindrical or prismatic surface of the injector 20, but not in contact with this before of the spurious depositions), the thickness of the deposited material is limited, in particular by the distance between the internal surface of the element 80 and the external surface of the injector 20; as soon as these deposits approach the internal surface of the element 80 (for example particularly protruding portions of the deposits such as tips), they are removed from the element itself.

In general, it is advantageous to use a body that moves within the reaction and deposition zone and that has at least one surface that moves close to at least one surface that is subject to spurious depositions, but not in contact therewith (before spurious depositions).

An example of embodiment of the reaction chamber 100 according to the present invention will be described below with the aid of FIG. 2 and FIG. 3.

The chamber 100 comprises a tube 110, an injector 20 and a holder 30; the tube 110 is made of quartz and has a cylindrical (or prismatic) shape and surrounds a reaction and deposition zone (which, in particular, corresponds to substantially the entire volume inside the tubular element 10); the injector 20 is arranged to inject precursor gases into the reaction and deposition zone; the holder 30 is arranged to support (at the bottom) a substrate in the reaction and deposition zone during deposition processes; the black rectangle in the figure corresponds to a substrate on which a considerable thickness of semiconductor material has been deposited. There are graphite susceptor elements 10, 40 and 50 which are located inside the tube 110 for heating the reaction and deposition zone and components inside the reaction and deposition zone; these three elements are cylindrical (or prismatic) tubes; the element 10, which is external and of larger diameter, is used to provide generalized heating, while the elements 40 and 50 are used to provide localized heatings. There is an inductor system, consisting of the assemblies 60 and 70, which is located outside the tube 110 for providing energy to the susceptor elements 10, 40 and 50 by electromagnetic induction. Finally, there is a rotating element 80 in the form of a cylindrical (or prismatic) tube which is located inside the reaction and deposition zone and surrounds the injector 20.

FIG. 2 further shows a cylindrical (or prismatic) tube 120 of thermal insulating material located between the element 110 and the element 10.

It should be noted that, according to this embodiment, the components 10, 20, 30, 40, 50, 60, 70, 80, 110 and 120 have a cylindrical symmetry and their axes coincide (at least substantially) and correspond to the axis AA.

The element 80 is such as to limit deposition of semiconductor material on the external surface of the injector 20 and/or on the internal surface of a bottom susceptor element 50.

Preferably, the element 80 is made of graphite.

The element 80 is located between the injector 20 and the susceptor element 50.

The cylindrical tube of the element 80 can be axially divided into tube sections 81', 81", 81''', 81'''', i.e. rings, mechanically coupled between each other.

A first cylindrical graphite susceptor element 40 is at a first (upper) end of the tube 110 and may be moved in a direction parallel to the axis AA (the movement means are not shown in the figures).

A second cylindrical graphite susceptor element 50 is at a first (lower) end of the tube 110 and may be moved in a direction parallel to the axis AA (the movement means are not shown in the figures).

A first inductor assembly 60 is at a first (upper) end of the tube 110 and is associated with the first susceptor element 40; it may be moved in a direction parallel to the axis AA (the movement means are not shown in the figures).

A second inductor assembly 70 is at a second (lower) end of the tube 110 and is associated with the second susceptor element 50; it may be moved in a direction parallel to the axis AA (the movement means are not shown in the figures).

At one of its ends, the element 80 is mechanically coupled to a base device 82, in particular a crown, adapted to receive a rotation motion from a motor (schematically shown in the figure with a block 84) and to transmit the rotation motion to the element 80; preferably, the base device 82 has a plurality of gear teeth at its radial periphery; in FIG. 3, the block 84 is a small toothed pinion (driven by an electric motor) whose teeth mesh with the teeth of the large crown 82.

The cylindrical tube of the element 80 can have an interspace (not shown in the figures) which extends over its length (parallel to the axis AA), and which has an annular-shaped transversal cross-section.

According to a first advantageous possibility, the cylindrical tube of the rotating element 80 has an external surface 80E being rough or rugged and/or an internal surface 80I being rough or rugged; these surfaces which move with respect to the surfaces of the elements 20 and 50 favour an abrasive action on spurious deposits.

According to a second advantageous possibility, wherein the cylindrical tube of the rotating element 80 has an external surface 80E with at least one helical thread T and/or an internal surface 80I with at least one helical thread T; these moving surfaces that move with respect to the surfaces of the elements 20 and 50 favour gaseous motions and/or the transport of solid material (for example downwards).

It should be noted that the first possibility and the second possibility can be combined.

In FIG. 3, a first interspace is visible between the external cylindrical surface 20E of the injector 20 and the internal cylindrical surface 80I of the element 80, and a second interspace between the external cylindrical surface 80E of the element 80 and the internal cylindrical surface 50I of the susceptor element 50. According to an exemplary embodiment, the thickness of the first interspace (for example 1-10 mm) is smaller than the thickness of the second interspace (for example 1-10 mm); however, in general, the two thicknesses can also be the same.

According to the embodiment described, the rotating element has the shape of a cylindrical or prismatic tube; however, first variants may be conceived in which this rotating element has a different shape, for example a truncated cone or a pyramidal trunk or a two-base sphere segment or . . . .

The reaction chamber according to the present invention can advantageously comprise means for removing dust, i.e. the dust generated by the rotating element 80 due to its movement; the previously mentioned helical threads can be considered to be part of these means.

These means can correspond to gas flow inlets and/or gas flow outlets. For example, considering FIG. 3, there is a lower wall 90 of the reaction chamber with a first annular zone 92 and a second annular zone 94 highlighted; in one or both of these zones a set of holes can be provided adapted to suck up the dust coming from the interspaces.

The reaction chamber according to the present invention can advantageously comprise a cleaning assembly fluidly coupled to the gas flow inlets and/or gas flow outlets. Preferably, this assembly is adapted to be inactive during deposition processes, so as not to create unwanted gas flows during deposition processes.

The reaction chamber according to the present invention advantageously comprises a moving assembly mechanically coupled to the rotating element 80 and adapted to convey a rotation movement to the rotating element 80; the elements 82 and 84 of FIG. 3 can be considered to be part of this assembly.

The moving assembly can be adapted to convey an alternating rotating movement to the element 80.

The moving assembly can be adapted to convey an alternating translational movement to the element 80.

A reaction chamber such as the one just described finds use in particular in reactors for deposition of layers, for example of silicon carbide on substrates, in particular in reactors adapted to carry out deposition processes at a very high temperature.

The invention claimed is:

1. A reaction chamber for a reactor for deposition of layers of semiconductor material on substrates, comprising:
   a tube made of quartz, having a cylindrical or prismatic shape and surrounding a reaction and deposition zone;
   an injector arranged to inject precursor gasses into the reaction and deposition zone;
   a holder arranged to support a substrate in the reaction and deposition zone during deposition processes;
   graphite susceptor elements located inside the tube for heating the reaction and deposition zone and components inside the reaction and deposition zone;
   an inductor system located outside the tube for providing energy to the graphite susceptor elements by electromagnetic induction; and
   a rotating element in a form of a cylindrical or prismatic tube located inside the reaction and deposition zone and surrounding the injector, wherein the rotating element is separate and axially spaced from the holder;
   wherein the graphite susceptor elements comprise a first cylindrical or prismatic graphite susceptor element at a first end of the tube, the first cylindrical or prismatic graphite susceptor element configured to be movable in a direction parallel to the axis of the tube and a second cylindrical or prismatic graphite susceptor element at a second end of the tube, the second cylindrical or prismatic graphite susceptor element configured to be movable in the direction parallel to the axis of the tube.

2. The reaction chamber according to claim 1, wherein the rotating element is arranged so that deposition of layers of semiconductor material on an external surface of the injector or on an internal surface of a bottom susceptor element is prevented.

3. The reaction chamber according to claim 1, wherein a first inductor assembly is at the first end of the tube and is associated with the first cylindrical or prismatic graphite susceptor element and a second inductor assembly is at the second end of the tube and is associated with the second cylindrical or prismatic graphite susceptor element.

4. The reaction chamber according to claim 1, wherein the rotating element is made of graphite.

5. The reaction chamber according to claim 1, wherein the rotating element is located between the injector and a respective one of the graphite susceptor elements.

6. The reaction chamber according to claim 1, wherein the rotating element comprises a plurality of rings mechanically coupled to each other along an axial direction.

7. The reaction chamber according to claim 1, wherein at an end the rotating element is mechanically coupled to a base device adapted to receive a rotation motion from a motor and to convey the rotation motion to the rotating element, wherein the base device has a plurality of gear teeth at a radial periphery of the base device.

8. The reaction chamber according to claim 1, wherein the cylindrical or prismatic tube of the rotating element has an interspace that extends along a length of the cylindrical or prismatic tube, and that has an annular-shape transversal cross-section.

9. The reaction chamber according to claim 1, wherein the cylindrical or prismatic tube of the rotating element has an external surface with at least one helical thread or an internal surface with at least one helical thread.

10. The reaction chamber according to claim 1, comprising means for removing dust.

11. The reaction chamber according to claim 10, wherein said means for removing dust comprises gas flow inlets or gas flow outlets.

12. The reaction chamber according to claim 11, wherein said gas flow inlets or gas flow outlets are located at a bottom of the reaction chamber.

13. The reaction chamber according to claim 1, comprising a moving assembly mechanically coupled to the rotating element and arranged to convey a first rotation movement to the rotating element.

* * * * *